(12) United States Patent
Dessiatoun et al.

(10) Patent No.: US 6,898,082 B2
(45) Date of Patent: May 24, 2005

(54) ENHANCED HEAT TRANSFER STRUCTURE WITH HEAT TRANSFER MEMBERS OF VARIABLE DENSITY

(76) Inventors: Serguei V. Dessiatoun, 3605, 43-rd Ave., Colmar Manor, MD (US) 20722; Igor Ivakhnenko, 9206 Glenville Rd., Silver Spring, MD (US) 20901

( * ) Notice: Subject to any disclaimer, the term of this patent is extended or adjusted under 35 U.S.C. 154(b) by 202 days.

(21) Appl. No.: 10/434,071

(22) Filed: May 9, 2003

(65) Prior Publication Data

US 2003/0227732 A1 Dec. 11, 2003

Related U.S. Application Data

(60) Provisional application No. 60/378,965, filed on May 10, 2002.

(51) Int. Cl.$^7$ ................................................. H05K 7/20
(52) U.S. Cl. ................. 361/699; 165/80.4; 165/104.33; 165/170; 165/185; 257/715; 257/722; 257/714; 361/700; 361/696; 361/703
(58) Field of Search ............................... 165/80.2, 80.4, 165/104.33, 185, 170; 257/722, 715, 714; 361/687, 698–699, 700, 703, 696

(56) References Cited

U.S. PATENT DOCUMENTS

| | | | |
|---|---|---|---|
| 3,524,497 A | * | 8/1970 | Chu et al. .................. 165/80.4 |
| 4,765,397 A | | 8/1988 | Chrysler et al. |
| 4,981,172 A | | 1/1991 | Haerle |
| 5,005,640 A | | 4/1991 | Lapinski et al. |
| 5,205,353 A | | 4/1993 | Willemsen et al. |
| 5,321,888 A | | 6/1994 | Nemes |
| 5,349,498 A | | 9/1994 | Tanzer et al. |
| 5,380,956 A | | 1/1995 | Loo et al. |
| 5,646,824 A | * | 7/1997 | Ohashi et al. ............... 361/699 |
| 5,950,714 A | * | 9/1999 | Schneider et al. .......... 165/80.3 |
| 5,966,291 A | | 10/1999 | Baumel et al. |
| 5,978,220 A | * | 11/1999 | Frey et al. .................. 361/699 |
| 6,005,772 A | * | 12/1999 | Terao et al. ................. 361/699 |
| 6,014,312 A | | 1/2000 | Schulz-harder et al. |
| 6,196,307 B1 | | 3/2001 | Ozmat |
| 6,563,709 B2 | * | 5/2003 | Shimamura et al. ......... 361/699 |
| 6,578,626 B1 | * | 6/2003 | Calaman et al. ............ 165/80.4 |

FOREIGN PATENT DOCUMENTS

| | | |
|---|---|---|
| CA | 1238428 | 8/1987 |
| EP | 0376365 B1 | 4/1990 |
| JP | 60-229353 | 10/1986 |
| WO | WO 99/09594 | 2/1999 |

* cited by examiner

Primary Examiner—Gregory Thompson
(74) Attorney, Agent, or Firm—Rosenberg, Klein & Lee

(57) ABSTRACT

A heat transfer structure includes a heat transfer module having a plurality of heat transfer members in the duct chamber with the density increased in the direction of the flow of the coolant and having a greatest density adjacent to the position of a heat source attached in thermal contact with the heat transfer module. The profile of the duct chamber is adjusted to the position of the heat source to increase the velocity of coolant directly under the heat source and to partially or completely block the coolant flow to the areas which do not need to be temperature adjusted. The heat transfer members may be formed as pin fins fabricated from springs compressed to a predetermined density in a direction perpendicular to the longitudinal axis of the spring (and/or in parallel to the longitudinal axis of the heat transfer module).

25 Claims, 9 Drawing Sheets

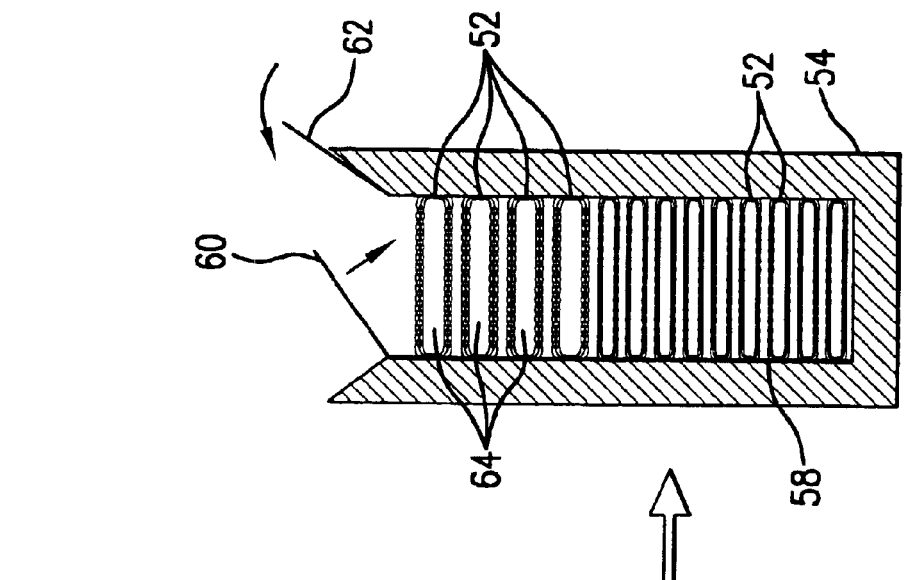
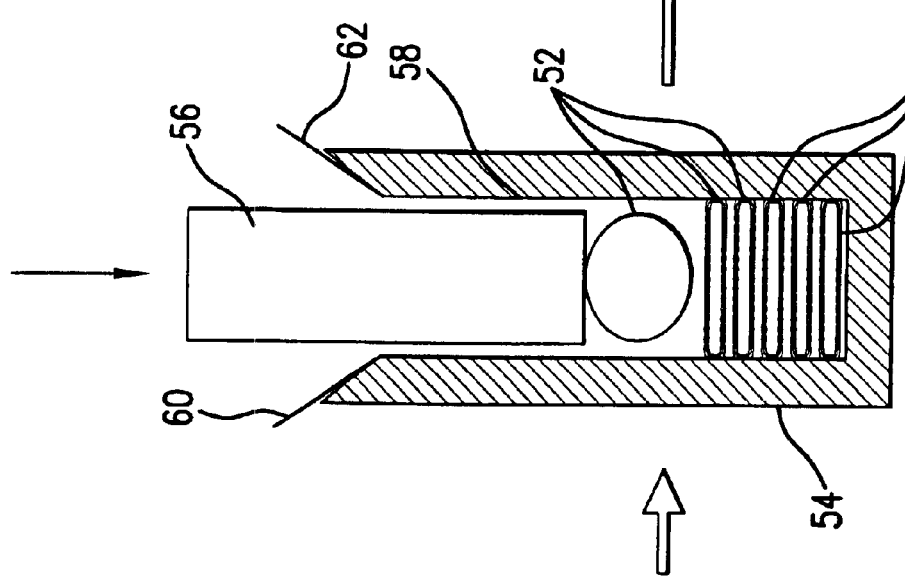
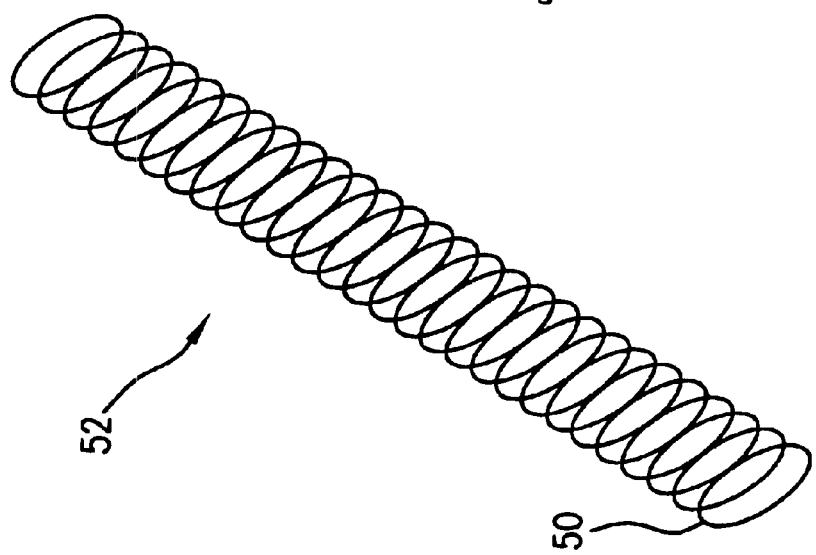

ENHANCED HEAT TRANSFER STRUCTURE WITH HEAT TRANSFER MEMBERS OF VARIABLE DENSITY

REFERENCE TO RELATED APPLICATIONS

This Utility Patent Application is based on Provisional Patent Application Ser. No. 60/378,965, filed on May 10, 2002.

FIELD OF THE INVENTION

The present invention relates to heat transfer structures and methods of transporting heat. More in particular, this invention pertains to heat transfer structures for cooling electronics and other heat generating devices.

Still further, the subject invention pertains to heat transfer structures which use the concept of variable density heat transfer members, for example pin fins, within the heat transfer structure to promote efficient thermal transport.

BACKGROUND OF THE INVENTION

In order to improve power and speed of electronics, while simultaneously decreasing the size of electronic devices, efforts have been made to develop efficient ways to dissipate heat generated by electronic devices. Heat flux of 100W/cm$^2$ and higher in semiconductor elements are standard in any applications of electronics. Heat flux is usually transmitted through a substrate and/or a base plate of an electronic device to a heat sink. The heat spreading or dissipation capabilities of the substrate and the base plate are usually limited by the thermal conductivity of the substrate and the base plate material which even in the best case of composites is generally not higher than 600 W/mK. If the heat sink is unable to remove the high heat flux, the heat spreading resistance adds to the temperature rise of the semiconductor device and thus may lead to the failure of the device.

Heat sinks of different designs have been developed through the decades. The most common geometry for heat sinks is flat fin type heat sinks, as for example described in U.S. Pat. Nos. 5,005,640; 5,349,498; and 5,966,291. These heat sinks are inexpensive, reliable, and simple to fabricate. However, the heat dissipation of flat fin geometry heat sinks are generally low due to the small surface area of the fins and a relatively low heat transfer coefficient. Therefore, the total thermal resistance built between the heat source and the coolant is disadvantageously high. As a result, such heat sinks are unable to provide sufficient cooling of modern electronics and other high heat flux sources.

As an alternative to flat fins, more complex geometries currently used for high heat flux electronics take advantage of sintered particles (Canadian Patent #1,238,428; U.S. Pat. No. 5,205,353; and PCT Publication WO 99/09594), sintered mesh (Japanese Publication #60-229353 and U.S. Pat. No. 4,981,172), metal foams (U.S. Pat. No. 5,321,888), or even more complex geometries and compositions using internal jet impingement effects (U.S. Pat. No. 5,380,956 and U.S. Pat. No. 6,014,312). Such heat sinks provide for a heat transfer coefficient which is one or two orders of magnitude higher than flat fin type heat sinks. However, these geometries and compositions are not optimal for heat conduction since the heat travels through a relatively long path before rejection to a coolant media.

In contrast to the aforesaid heat sinks, U.S. Pat. No. 6,196,307 presents a heat transfer structure with greatly improved efficiency which includes within its structure a compressed metal foam composition. In the heat sink of '307 patent the metal foam is compressed in X-Y direction to provide an aligned foam structure in the direction of heat flow. However, the potential of the heat transfer surface is underused and simultaneously, the pressure drop through the heat transfer structure is generally large.

Pin fins, such as described in EP 0376365, provide a more efficient use of the heat transfer surface. The pin fins are aligned in the direction of the heat flow, substantially perpendicular to the base plate. The efficiency of such a heat transfer structure may attain high magnitudes approaching one. The heat transfer coefficient between fins and a cooling fluid may be potentially high if the diameter of the fins is small and the heat transfer boundary layer on the surface of the fins is in the size range of microns. To create high convection heat transfer, flow passages in those surfaces are usually less than 1 mm and very often, smaller than 100 microns.

Therefore, the pressure drops through these heat transfer structures is generally high and the surfaces are susceptible to clogging by particles present in coolant fluid. If the structure is uniform, particles from a coolant fluid are deposited on the front surface of the structure initiated by particles that are larger than the openings of the heat transfer structure. Such particles partially clog the heat transfer surface, and cause a decrease in the cross-sections of the flow passages which trap smaller particles in an increasing manner until the coolant fluid flow is substantially blocked.

In U.S. Pat. No. 6,196,307 compressed foam structure is organized in a last set of layers of different density metal foam. These layers have different heat transfer performances which correspond to variable heat input from respective heat sources. The layers of different density extend across a generally rectangular duct of constant cross-sectional area. The density of the foam layers used in a particular location is determined by the heat input at the particular location. The sequence of the layer positioning depends on the distribution of heat sources. Increasing density in a particular layer, results in increasing the heat transfer area and the fluid velocity in the layer which results in a heat transfer coefficient increase between the heat transfer structure and the cooling fluid. In this manner, heat removing capabilities of a particular layer increase. The layer of maximum density is positioned adjacent the hottest heat source. The remainder of the structure has a lower density and correspondingly creates a lesser pressure drop. In this manner, the total pressure drop through the heat sink is significantly reduced.

As is the case in many prior art heat sinks, the heat sink described in U.S. Pat. No. 6,196,307 is susceptible to clogging which occurs on the frontal surfaces of the layers. Clogging also depends on the density of the layer, e.g., the fastest clogging occurs in the most dense layer. Despite the fact that in electronic applications the heat source is usually localized, the layer of highest density beneath or adjacent the heat source cannot be fabricated to exactly correspond to the dimensions of the heat source. The layer is generally extended across the duct. Otherwise, the coolant fluid passes around the highest density area to the layers of lower density. A small portion of the coolant fluid passes in proximity to the heat source, resulting in a nullification of any effects of densification of the structure.

In this case, in order to maintain the overall heat transfer performance of the heat sink satisfactorily, the velocity of the coolant in the entire foam layer has to be increased. Additionally, the density of the entire foam layer has to be much higher than the heat transfer requirement as compared to the situation where the entire flux of the coolant fluid would aid in the heat transfer process. The higher density of the layer causes the decrease of the cross-section of flow passages through the foam layer which undesirably amplifies its susceptibility to clogging.

It is highly desirable to therefore have a heat transfer structure free of the shortcomings of prior art heat sinks as previously described.

SUMMARY OF THE INVENTION

It is therefore an object of the present invention to provide a heat transfer structure capable of highly efficient heat transfer with a low susceptibility to clogging, wherein a plurality of heat transfer members of different density concentration are positioned in a predetermined order so that the density concentration of the heat transfer members increases in the direction of the coolant media flux towards the heat source of the highest temperature.

It is a further object of the present invention to provide a heat transfer structure with an internal non-uniform density of the heat transfer members, wherein a high efficiency of heat transfer is attained by gradual or periodical variations in the density of the heat transfer surface, profiling of the cross-section area of the coolant flux, and by redistributing the coolant flow internally to minimize clogged areas.

It is still a further object of the present invention to provide a heat transfer structure of the pin fin type where pin fins are formed from wire springs compressed to a predetermined density in a direction substantially perpendicular to the longitudinal axis of the wire springs.

Another object of the present invention to provide a heat transfer structure of the pin fin type employing flow restriction members positioned at predetermined locations of the coolant flux to increase flow velocity and heat transfer performance of the heat transfer structure under or adjacent the heat source without excessive increase in density of the heat transfer structure, and/or to redistribute the coolant flux to avoid areas which do not need a cooling effect.

It is another object of the present invention to provide a heat transfer structure where the thermal expansion of the heat source and the heat transfer module are equalized by (1) using an intermediate layer material between the module and the heat source, or (2) fabricating the entire module (or parts thereof) from a material with the coefficient of the thermal expansion similar to the material of the heat source, or (3) incorporating ceramic with directly bonded copper or other metal as a portion of the heat transfer module, or (4) maintaining uniform temperature of multiple heat sources.

It is also an object of the present invention to provide the heat transfer structure of the pin fin type where the continuous fiber or wire structure shaped into pin fins are positioned substantially perpendicular to the heated surface and to the coolant flow direction, which increases the heat transfer effectiveness of the heat transfer structure.

It is still another object of the present invention to provide a method for transferring heat from a localized heat source by means of a heat transfer structure of the pin fin type. This is accomplished by choosing a proper density distribution of the pin fins and by providing an increased velocity of the coolant flow in accord with the location of the localized heat source.

In accordance with the teachings of the present invention, a heat transfer structure includes a heat transfer module having a pair of module walls attached to each other along their perimeters and forming a duct chamber therebetween. A plurality of heat transfer members (preferably including but not limited to pin fins, sintered particles, etc.) in the duct chamber extend between the first and second module walls in contiguous contact therewith (and preferably bonded thereto) which are directed preferably perpendicular to flow direction and generally perpendicular to the heated surface. For example, the fins may be formed from wire springs compressed to a predetermined density in a direction substantially perpendicular to the longitudinal axis of the wire springs (or along the heat transfer module). The heat transfer members have increased density concentration in the direction of the coolant media.

At least one localized heat source is positioned at a predetermined location in an adjacent one of the module walls and in thermal communication therewith. The density of the pin fins in the heat transfer module is adjusted to the predetermined location of the localized heat source. Preferably, the pin fins have maximum density at the predetermined location of the localized heat source. Each wire spring may be formed of a single or multi-string wire.

The duct chamber is profiled in accordance with the predetermined location of the localized heat source by flow restriction members which are positioned in the duct chamber to increase the velocity of the coolant flow under or in the vicinity of the heat source, and/or to redistribute the coolant flow in order to partially or completely block the flow under the areas which do not need to be subject to a cooling effect.

The pin fins in the duct chamber are arranged in heat transfer blocks with each having a different density of the pin fins. A heat transfer block with the highest density of the pin fins is preferably aligned with a predetermined location of the localized heat source. In each block of the pin fins the density of the pin fins increases in the direction of the coolant media flow. The density of the pin fins either in each block or in the entire structure may increase either gradually or periodically (layer by layer).

The heat transfer module is provided with an inlet port for entrance of the coolant media and an outlet port for exiting the coolant media. This may be supplemented with an external unit for circulating the coolant media through the heat transfer module and with external means for cooling the coolant media.

The heat transfer module may be used as a heat sink or a pair of heat transfer modules may be attached each to the other to be used as a heat exchanger. Still further, the heat transfer module may also perform as a heat pipe if the coolant media is charged into the heat transfer module and both the inlet and outlet ports of the module are closed.

The module walls may be fabricated of a material having the same coefficient of the thermal expansion as the coefficient of the thermal expansion of a material of the localized heat source.

Further, a layer of a material having a coefficient of thermal expansion similar to the coefficient of thermal expansion of the localized heat source may be positioned on the entire surface of the heat transfer module wall to restrain the thermal expansion thereof. In addition, a ceramic insulator layer laminated on opposing sides with conductor layers may be bonded to at least one of the module walls. The coefficient of thermal expansion of the ceramic insulator layer is similar to the coefficient of thermal expansion of the material of the module walls. Alternatively, the ceramic insulator layer laminated on both sides thereof replaces one of the module walls. The module walls may be formed from carbon based composites, ceramics, and metal alloys.

In another aspect, the present invention presents a method for transferring heat from a localized heat source which includes the steps of:

attaching at least one localized heat source at a predetermined location on a wall of a heat transfer module, installing a plurality of heat transfer members in the duct chamber of the heat transfer module with a variable density which increases in the direction of the flow of the coolant media and has a greatest density adjacent the localized heat source, and installing flow restriction members in the duct chamber of the heat transfer module to increase the velocity of the coolant media flow at the predetermined location of the heat source and in order to at least partially block the coolant media flow around the localized heat source, e.g., at the areas which do not need cooling.

The heat transfer members may be manufactured in the form, for example, of pin fins. In this implementation, it is important that the pin fins are positioned at least substantially perpendicular to the flow direction, while simultaneously extending in a direction substantially perpendicular to the heated surface of the module.

These and other features and advantages of the heat transfer structure and the heat transfer method will be fully understood in view of the further detailed description of the preferred embodiment taken in conjunction with the Drawing Figures.

BRIEF DESCRIPTION OF THE DRAWINGS

FIG. 4 depicts a wire spring element from which pin fins are formed;

FIG. 5 illustrates schematically the fabricating process for manufacturing heat transfer blocks for the heat transfer module of the present invention;

FIG. 6 shows schematically how the separate compressed wire springs are secured each to the other to form a single heat transfer block;

DETAILED DESCRIPTION OF THE PREFERRED EMBODIMENTS

Figure 1:
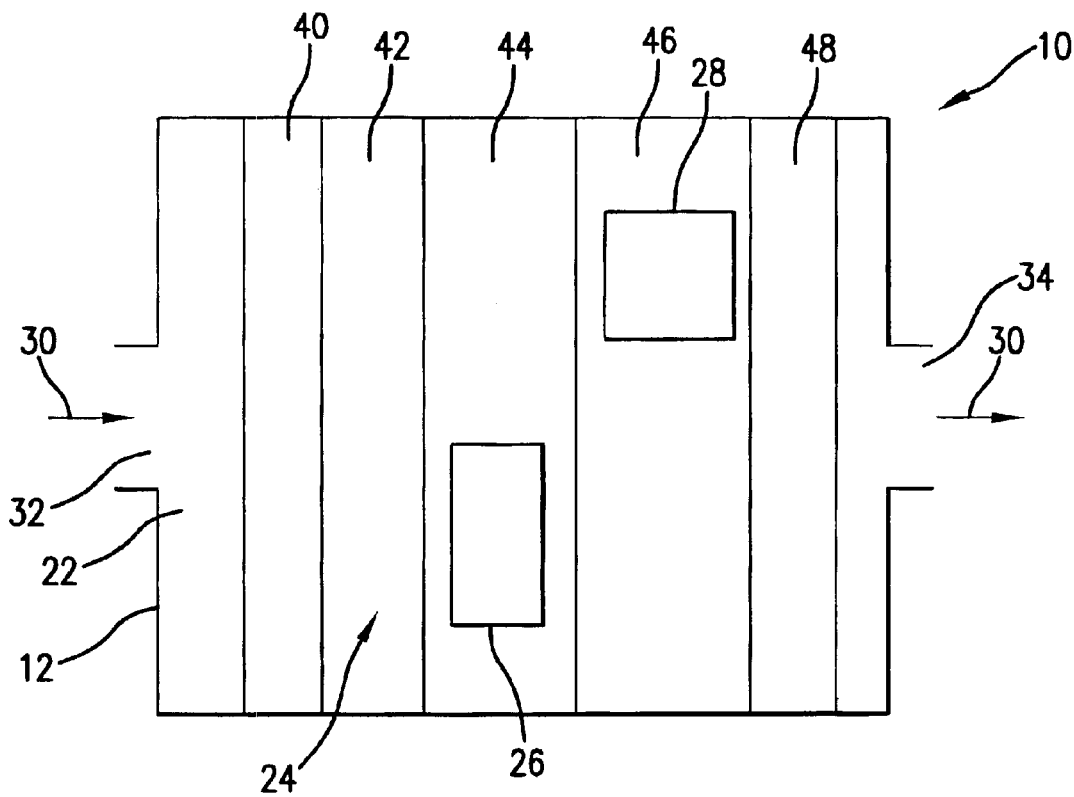
FIGS. 1 and 2 show schematically a top view and longitudinal cross-section of the heat transfer structure of the present invention.
Figure 2:
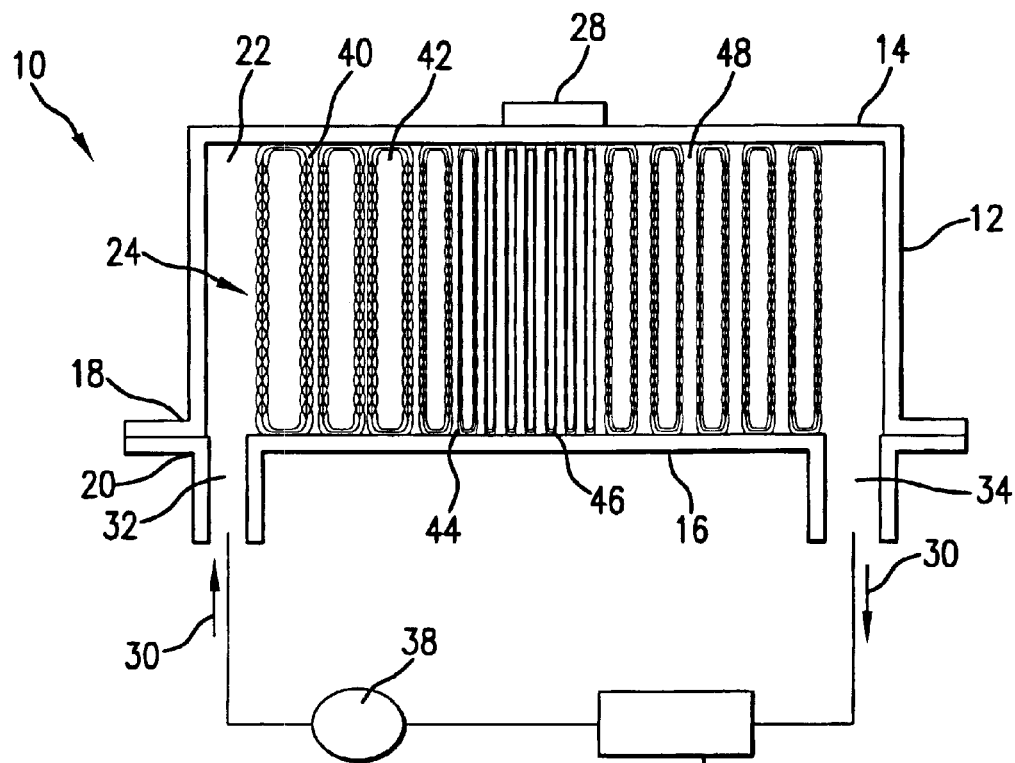

Referring to FIGS. 1 and 2, a heat transfer structure 10 is shown which includes a heat transfer module 12 having module walls 14 and 16 attached or fastened each to the other. For purposes of illustration, fastening of the walls 14 and 16 may be secured at perimeters 18 and 20 thus forming a duct chamber 22 therebetween. A plurality of heat transfer members, for example, in the form of perpendicularly directed pin fins 24 are positioned in the duct chamber 22 and extend between the module walls 14 and 16. Localized heat sources 26 and 28 represent heat generating semiconductor structures which are attached to the module wall 14 and are in thermal contact therewith.

A coolant media 30 is supplied to the inlet port 32 into the heat transfer module 12 and exits from the outlet port 34 thereof. The entry coolant media ingressing or being charged into the heat transfer module 12 is at a substantially lower temperature than the heat sources 26 and 28. The cooling media absorbs the heat generated by the heat sources 26 and 28 and further conveys this heat to the outlet port 34. During the heat transferring process, the coolant media 30 is itself heated, so that the temperature of the coolant media at the outlet port 34 is higher than the coolant media temperature at the inlet port 32.

In order to cool the coolant media 30, a cooling unit 36 known to those skilled in the art is established external the heat transfer module 12, in order to lower the temperature of the coolant. Additionally, the circulation of the coolant media through the heat transfer module 12 may be assisted through use of circulating unit 38 provided outside an external the heat transfer module 12. The circulating unit 38 may include pumps or other circulating units based on gravity, capillary, electric or magnetic field action.

Although, as shown in FIG. 2, the heat transfer module 12 acting as a heat sink is included in a loop, the same embodiment may operate in a heating mode. When a heating unit is used instead of the cooling unit 36, the system operates in a heating mode, where the heat is provided to the coolant fluid and absorbed by the heat sources 26, 28. In this embodiment, the enthalpy of the coolant media 30 entering into the heat transfer module 12 is higher than the enthalpy of the exiting coolant media 30.

As shown in FIGS. 1 and 2, the heat transfer module 12 is based on a non-uniform heat transfer structure which includes a plurality of heat transfer blocks 40–48 having different densities of pin fins therein which are integrated into the heat transfer module 12 and bonded to the walls 14 and 16. Bonding or securement to the walls 14 and 16 is accomplished through brazing, soldering, diffusion bonding, sintering, composite matrix deposition, or any like technique. The density of the pin fins in the overall heat transfer structure generally increases in the direction of the coolant flow 30 towards the hottest heat source 28 (as an example, the temperature of the heat source 28 is higher than the temperature of the heat source 26). In this manner, the heat transfer block 46 has the highest density which is higher than the density of the heat transfer block 44, which in its turn is higher than the density of the heat transfer blocks 42 and 48, and higher than the density of the heat transfer block 40. The heat transfer block 46 with the highest density is positioned adjacent the hottest heat source 28. The increase of the density from the block 40 to the block 46 may be gradual or layer by layer, dependent on the manufacturing process of the heat transfer module 12.

A plurality of heat sources may be attached to the wall of the heat transfer module 12. Therefore, a distribution of the heat transfer blocks of different density would be adjusted to a particular electronic circuitry design. For example if the heat source 26 has a temperature higher than the heat source 28, the heat transfer blocks 40–46 will extend with their densities increasing towards the highest temperature heat source 26.

As coolant flows through the heat transfer blocks the contamination particles in the fluid deposit themselves mostly on the surface of the heat transfer block of highest density and also gradually distribute themselves within heat transfer blocks 40–48. In this manner, the operation life of the heat sink is extended and the pressure drop is reduced in the heat sink of the present invention.

The pin fins 24, whether or not arranged in the heat transfer blocks 40–48, are formed from wire springs compressed to a predetermined density in a direction substantially perpendicular to the longitudinal axis of the wire springs. The wires may have closedly contoured cross-section of any shape. Although the pin fin type heat transfer module has been chosen as an example of the present invention, it will be clearly understood that the following materials and manufacturing processes may also be used for fabricating the heat transfer members of the present invention which include:

variable size sintered metal and ceramic particles, elongated variable size sintered metal and ceramic particles and fibers, compressed in the directions substantially perpendicular to the heat flow, elongated variable size carbon or carbon rich particles and fibers, compressed in the directions perpendicular to the heat flow, forming a composite, or SiC ceramic, variable density metal, graphite, and SiC foams, variable density metal foams compressed in a direction substantially perpendicular to the heat flow, variable density polymer foams compressed in the direction substantially perpendicular to the heat flow and converted to SiC, variable wire diameter sintered or brazed metal springs compressed in the direction substantially perpendicular to the heat flow, variable diameter sintered twisted or cabled wire metal springs compressed in the direction substantially perpendicular to the heat flow into a structure of different density, constant diameter sintered or brazed wire metal springs compressed in the direction substantially perpendicular to the heat flow into the structure of different density, constant diameter sintered twisted or cabled wire metal springs compressed in the direction substantially perpendicular to the heat flow into the structure of different density, carbon or carbon rich fiber twisted and coiled into a spring-like shape and compressed in the direction substantially perpendicular to the heat flow into a structure of different density and processed into a composite or SiC, and/or sewed, stitched, or woven fiber structure of variable density converted to a composite or SiC.

An embodiment for the heat transfer structure of the present invention which produces excellent heat transport criteria is the constant diameter sintered twisted or cabled copper wire metal springs are compressed in the direction of coolant flow forming a structure of variable density. The heat transfer assembly was tested with a heat flux up to $4.5 \times 10^6$ W/m$^2$, and exhibited constant thermal resistance of $7 \times 10^{-6}$ Km$^2$/W. The heat transfer structure, as a heat sink of such resistance, permits operation of Si based electronics with heat fluxes of more than 1000 W/cm$^2$ with a coolant being inserted at ambient temperature.

Figure 3:
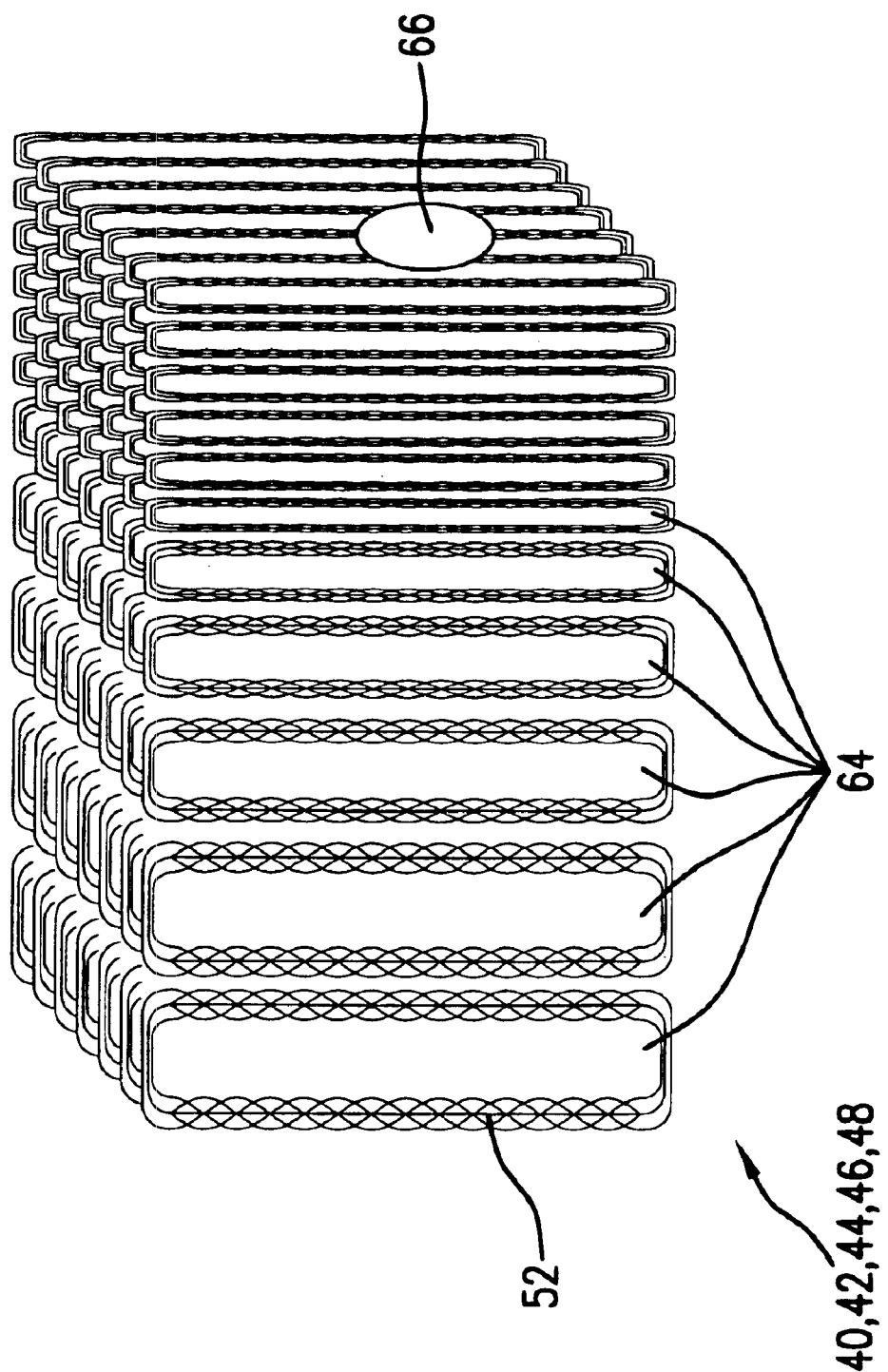
FIG. 3 is a perspective view of the heat transfer block fabricated from variable diameter twisted or cabled wire or fiber thread.

FIG. 3 shows a perspective view of a non-uniform heat transfer structure of the present invention with variable diameter twisted or cabled wire or fiber thread. As seen, the wire or fiber thread 50 is coiled into a spring-like shape 52 shown in FIG. 4, and compressed in the direction perpendicular to the longitudinal axis of each spring as shown in FIGS. 5 and 6. The wire (or fiber) of the spring 52 may be manufactured of a cross-section of any closed contour. A single string or multi-string wire concept may be used. Multi-string wire may be preferable since it provides a larger heat transfer area and a higher heat transfer coefficient. Additionally, multi-string wire is generally more flexible, thus providing better formability than single string wire of the same diameter.

The diameter of wire and the pin fin height is chosen based on calculation of performance of pin fin geometry in the fluid flow for particular flow conditions. The spring is cut into pieces 52 which are compressed in a mold 54, shown in FIGS. 5 and 6, to a predetermined or design density. The length of the mold 54 is substantially equal to the length of a single or multiple heat transfer block 40–48. The density of the thus fabricated heat transferring pin fins is variable in the heat transfer module 12.

The density corresponds to the heat load which the structure is handling. Adjacent the highest heat flux portion of the heat sink the density of the structure is increased. By varying the displacement of the plunger 56, the compression of the springs 52 varies, which permits different densities of the pin fins in the heat transfer blocks 40–48. Computer control of the plunger 56 displacement may be used to provide a system with tight tolerances and increased accuracy.

The density of the structure compensates for any degradation of the cooling capacity of the cooling fluid. After a plurality of springs 52 are compressed to a desired density in the mold 54 the heat transfer block is formed by securing the compressed springs. This may be accomplished by bending the ends 60 and 62 of the wire or wire mesh 58 around the compressed springs 52 (the wire or wire mesh 58 is inserted into the mold 54 prior to loading the mold with the springs 52). The resulting structure may be spot-welded, glued or bonded together by chemical deposition of a bonding material. This structure may be, if needed, cut into heat transfer blocks of a required length.

As one of the examples of the manufacturing process for fabrication of the heat transfer blocks of the present invention, the heat transfer structure for the heat sinks was manufactured for integration into a Dynex semiconductor power module. The wire was formed from multi-string copper wire 0.6 mm in diameter with 0.12 mm diameter of a single string. The wire was wound into a continuous spring with a 2.2 mm inner diameter.

The spring was cut into pieces 52 with the length equal to the width of the heat sink (heat transfer module) 12 and compressed in the mold 54 having a 3.8 mm width. Fifteen pieces of the spring were compressed in the structure block of the width equal to 24 mm. The block included a 16 mm wide portion of high density structure and 8 mm wide of low density entrance area.

In the heat sink, the high density heat transfer structure is positioned under or adjacent the heat generating device.

The density of the structure in both the high and low density part or section of the block increased in the direction of the coolant flow. The block of the structure was fixed together by two wraps of copper wire of 0.45 mm in diameter. The fabricated heat transfer block of the structure is then placed in the body of the heat transfer module 12 having the height of 3.3 mm and compressed between the module walls 14 and 16. The compression of the heat transfer block in the duct chamber 22 of the heat transfer module 12 provides for a reliable contact during bonding of the heat sink.

The heat transfer blocks 40–48 of different densities are shown in the FIGS. 1 and 2 which were manufactured in accordance with the process shown in FIGS. 3–6. However, there may be as many variations in the structure density as is desired or as allowed by available space. Density of the pin fins formed from the springs may be changed gradually along a continuous spectrum or in discrete increments of densities, e.g., layer by layer.

The structure formed with the wire or thread of one diameter may also be sub-divided into the sub-structures of different densities depending on clogging protection requirements or heat dissipation requirements for the heat sink (heat transfer module) 12.

The edges of the heat source are usually of a lower temperature than the center thereof due to heat spreading effect of the wall 14 and other intermediate layers. The heat transfer block of the highest density 46, as shown in FIG. 1, is re-adjusted to accommodate this temperature difference between the center and the periphery of the heat source. Thus, the heat transfer block 46 in the area corresponding to the central portion of the heat source 28 has to be higher in density than the area which corresponds to the edges of the heat source. Additional readjustment of heat transfer performance may be accomplished by varying coolant velocity under the heat source by shaping fluid restrictions as will be further described with regard to FIGS. 7, 8, and 11.

Depending on the level of compression, the spring-like coiled wire or fiber threads may form residual internal channels 64. If clogging occurs in localized areas of the heat transfer block, the internal channels 64 redistribute the flow of the coolant, so that it by-passes the clogged areas. The channels 64 equalize the coolant flow through the heat sink, which minimizes the effect of local clogging on the heat sink performances. If the heat transfer module operates as a heat spreader (best shown in FIGS. 16 and 17) or as a heat sink the internal channels 64 are used as vapor channels.

Depending on the particular application of the heat transfer structure 10, additional channels 66, best shown in FIG. 3, of any desirable shape may be formed in the heat transfer blocks. These channels 66 may be drilled, punched, formed during the heat transfer block fabrication or otherwise positioned in the heat transfer module 12.

If the heat transfer structure 10 operates as a heat sink, additional channels 66 are used for adjusting the desired coolant velocity for the areas with a lower requirement of cooling. Such additional channels 66 also reduce the overall pressure drop. When the heat transfer structure 10 is used as a heat pipe (shown in FIG. 18) and the heat spreader (best shown in FIGS. 16 and 17), the channels 66 may provide additional vapor circulation. The same additional channels 66 may be formed in any type of heat transfer structure of the present invention.

The heat transfer blocks of different density may be fabricated from a coiled wire/fiber thread of the same or different thickness with a constant or variable pitch of the coils for the different densities. This heat transfer structure may be fabricated by using an enclosure (mold) 54 of the same geometry as the cross-section of the heat transfer module 12 with the height in the heat flux direction being approximately 2 to 20% greater than the height of the heat transfer module 12. The fiber thread prior to forming, may be filled up with a wax-like compound which is removed after fabrication of the compressed springs. The increased height in the heat flux direction may be used to provide reliable contact with the module walls 14, 16 of the heat transfer module 12 after compressing the heat transfer block between the module walls. This method can be also used to form the variable heat density transfer block directly inside the heat transfer module 12.

The maximum density of the heat transfer block 46 is dependent on the heat generated by the hottest heat source, the required surface area for heat transfer, and the available coolant velocity allowable by the heat transfer module. The higher the density of the heat transfer block, the smaller the passages which are formed to permit passage of the cooling fluid. Therefore, the smaller particles are deposited between the heat transfer pin fins. If the coolant velocity increases the same rate of heat transfer may be achieved with a heat transfer block of lesser density which in this case is more permeable for the coolant fluid and less susceptible to clogging. Additionally, another benefit of the increased velocity of the coolant fluid is that it tends to flush out particles that adhere to the heat transfer block, which further decreases the clogging of the structure.

Figure 7:
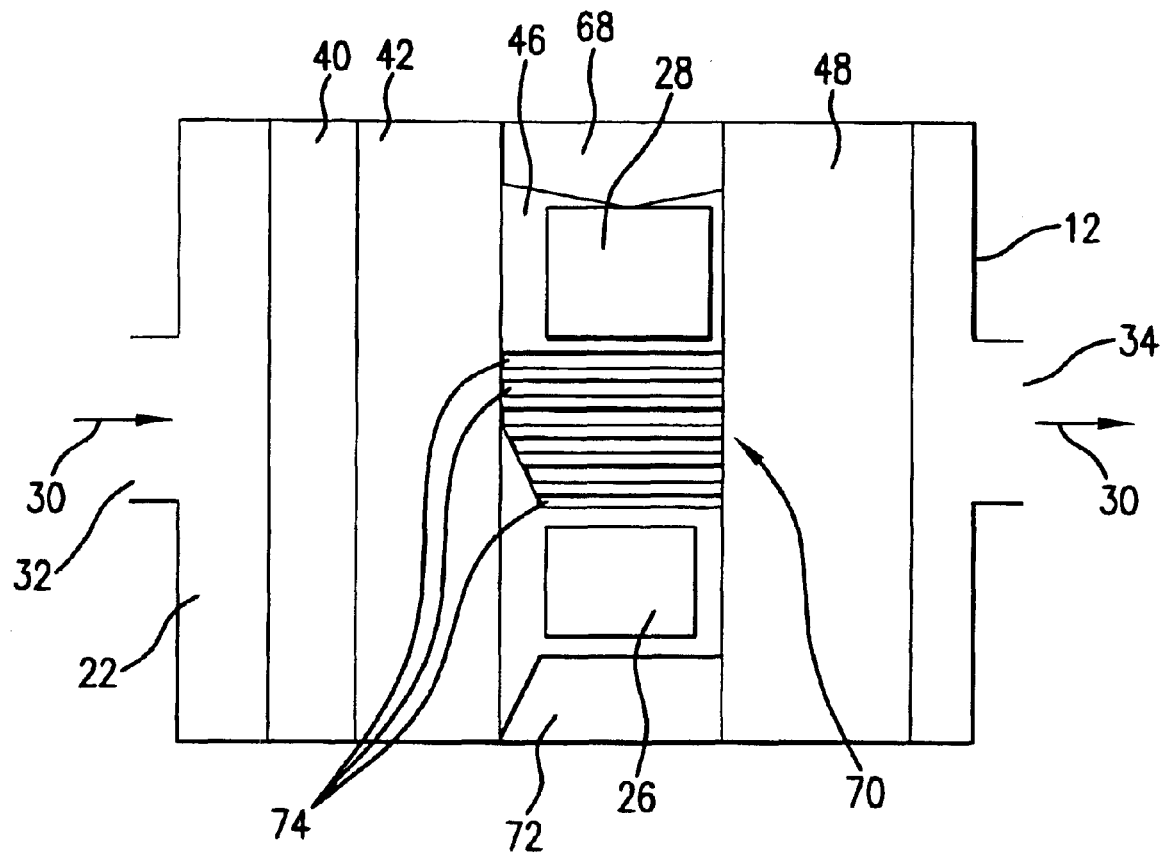
FIG. 7 shows schematically the heat transfer module of the present invention with channel forming flow restricting members.
Figure 8:
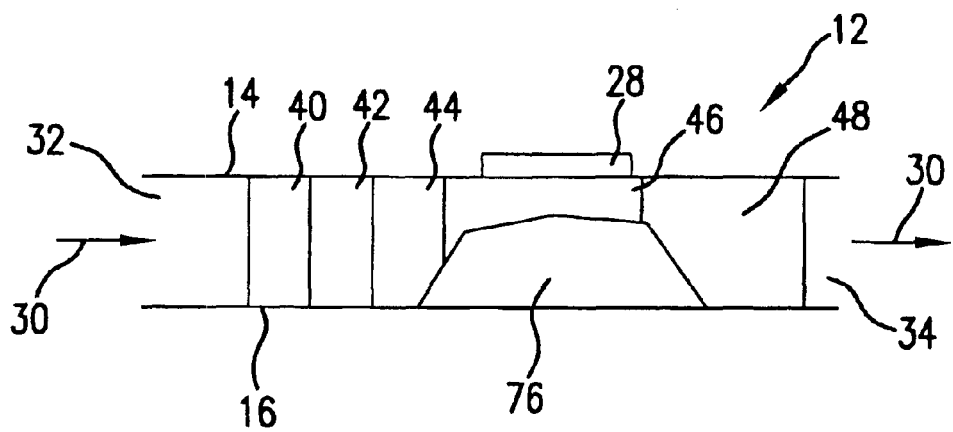
FIG. 8 is a schematic representation of the cross-section of the heat transfer module of the present invention with a vertical restriction under the heat source used for increasing the velocity of the coolant flow under the heat source.

In order to increase the velocity of the coolant flow under the heat sources 26 and/or 28, flow restriction members 68, 70, and 72 shown in FIGS. 7 and 8, are used in the heat transfer module 12 of the present invention. As is the usual case in the electronic circuitries, the heat sources are discrete and localized. The remaining portion of the circuitboard generally requires little or no cooling. In the present invention, the portion of the heat sink (heat transfer module 12) corresponding to these areas, may be completely or partially blocked with a flow restriction 68 and 72, best shown in FIG. 7. If an area requires partial cooling, the flow restriction 70 with channels 74 may provide a partial blockage of flow which permits some coolant circulation under the area. Further increase in coolant velocity may be achieved by restricting the flow in the vertical direction under the heat source by the flow restriction member 76.

Figure 9:
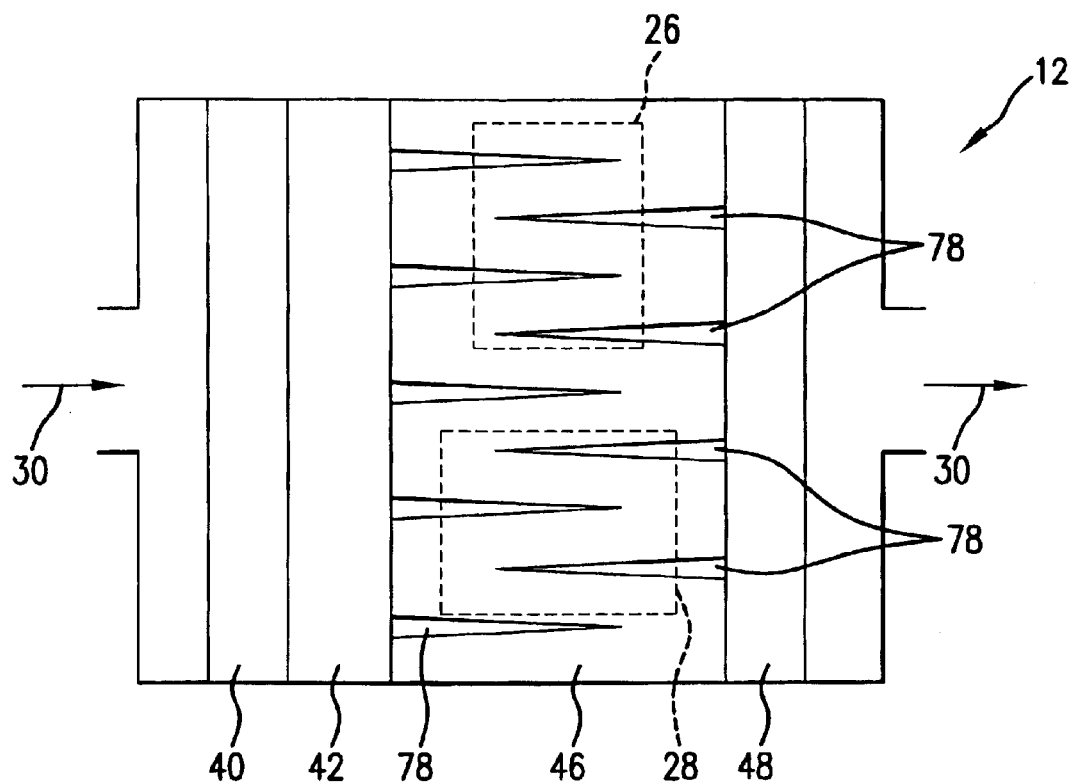
FIG. 9 is a schematic representation of the heat transfer module of the present invention with the internal channels formed in one of the heat transfer blocks.

Further improvement of the heat transfer module 12 of the present invention may be achieved by decreasing the clogging of the heat transfer structure through an increase in the frontal area of the heat transfer structure. This may be accomplished by waving or corrugating the heat transfer structure in the flow direction, or by forming internal channels 78, as shown in FIG. 9, by drilling, or other like techniques known to those skilled in the art. By forming the developed front area of each heat transfer block of different densities further decrease the clogging of the structure can be attained.

Often, it is beneficial to maintain the temperature of a single or multiple heat sources constant. This approach reduces thermal stress and increases the reliability of the heat transfer structure, especially if the components of the heat transfer module have low compliance, such as for example semi-conductors and ceramic insulators. In a heat sink, coolant temperature increases as the coolant absorbs heat as it flows past the heat source. The available temperature difference between the coolant and the heat source (e.g., the semiconductor), decreases in the flow direction.

Figure 10:
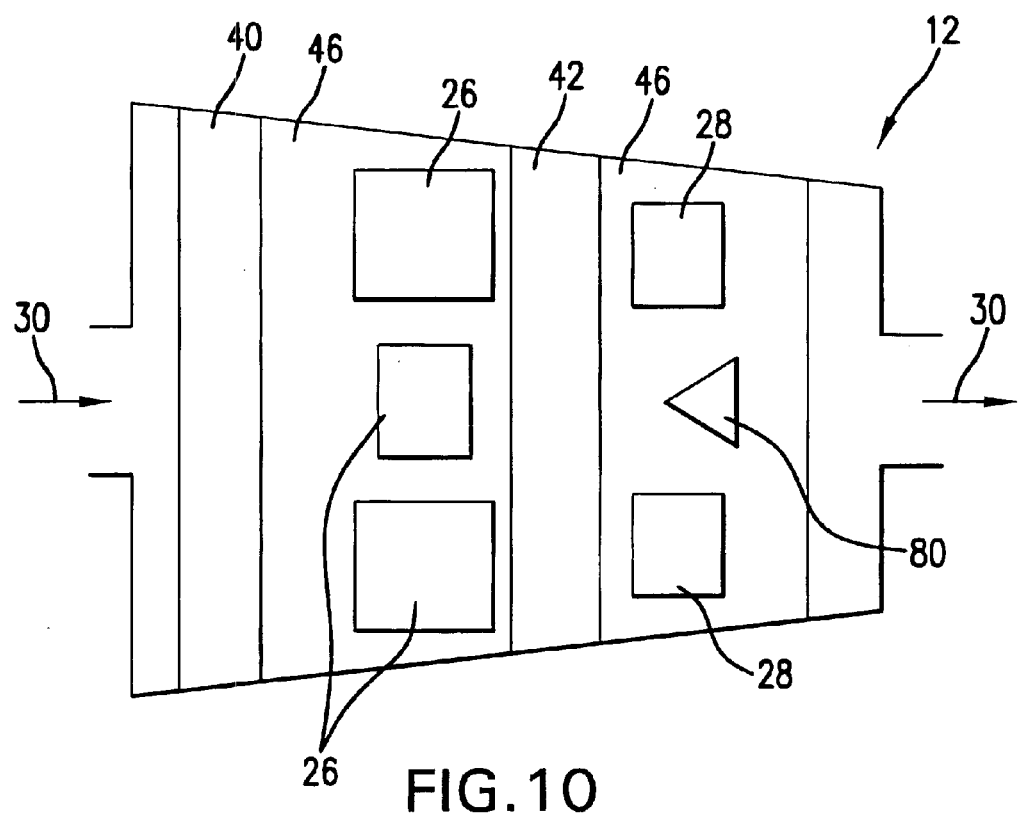
FIGS. 10 and 11 are the top view and longitudinal cross-section of the heat transfer module of the present invention showing a variable cross-section area of the flow path.
Figure 11:
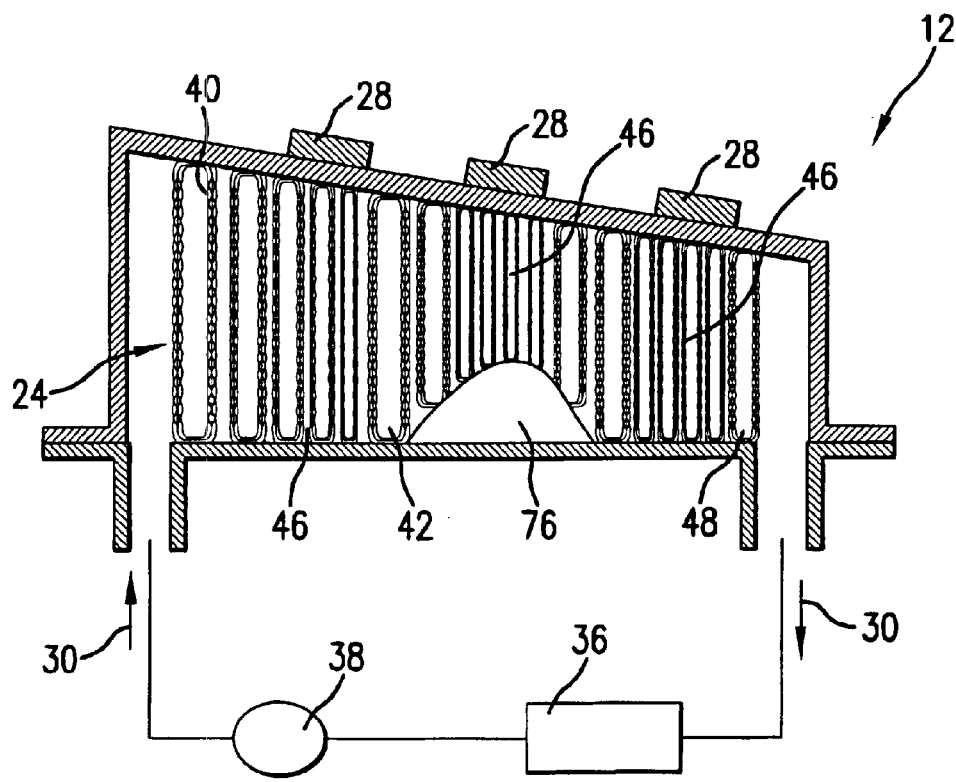

Declining cooling capacity of the coolant may be compensated for by increasing the heat transfer between the heat transfer block and the coolant. The increase in heat transfer may be achieved by increasing the coolant velocity through the heat transfer block which is accomplished by decreasing the cross-section area of the flow path in the heat transfer module 12, as shown in FIGS. 10 and 11. Heat transfer performance may additionally be increased by increasing the density of the heat transfer block and/or by placing flow restrictions 76 into the system, as was described in previous paragraphs. FIGS. 10 and 11 show variation in the geometry of the heat transfer structure used as a heat sink in order to increase the coolant velocity in the area of the heat source(s). The geometry of the duct chamber 22 of the heat transfer module 12 may be made more complex in order to achieve the desired velocity and the heat transfer rate. FIG. 10 depicts a flow restriction member 80 which may be advantageously used in the heat transfer structure of the present invention. The optimized heat transfer structure 10 fabricated is lighter in weight, has less clogging problems and creates a lower pressure drop throughout the heat transfer module than prior art structures.

Most heat exchangers experience similar problems to the problems experienced in heat transfer structures. A single phase fluid is heated or cooled as it passes through the heat exchanger. The heat capacity of the fluid is usually a maximum at the entrance to the heat exchanger and decreases gradually as the coolant fluid is displaced through the heat exchanger. The heat transfer structure most commonly in use has constant geometry throughout through the extent of heat exchanger. Thus, the greatest heat transfer takes place in the entrance area of the heat exchanger. The rate of heat transfer gradually decreases as the fluid is displaced toward the exit of the heat exchanger.

As a result, the fin efficiency in the entrance area is low and the potentially high heat transfer rate decreases due to the thermal resistance of the fins. At the exit of the heat exchanger the heat transfer rate is low due to the smaller temperature differential. As a result, the overall heat transfer is low and pressure drops through the heat exchanger is found to be generally high. The performance of the heat exchanger is significantly higher if it uses the non-uniform heat transfer structure of the present invention.

Figure 12:
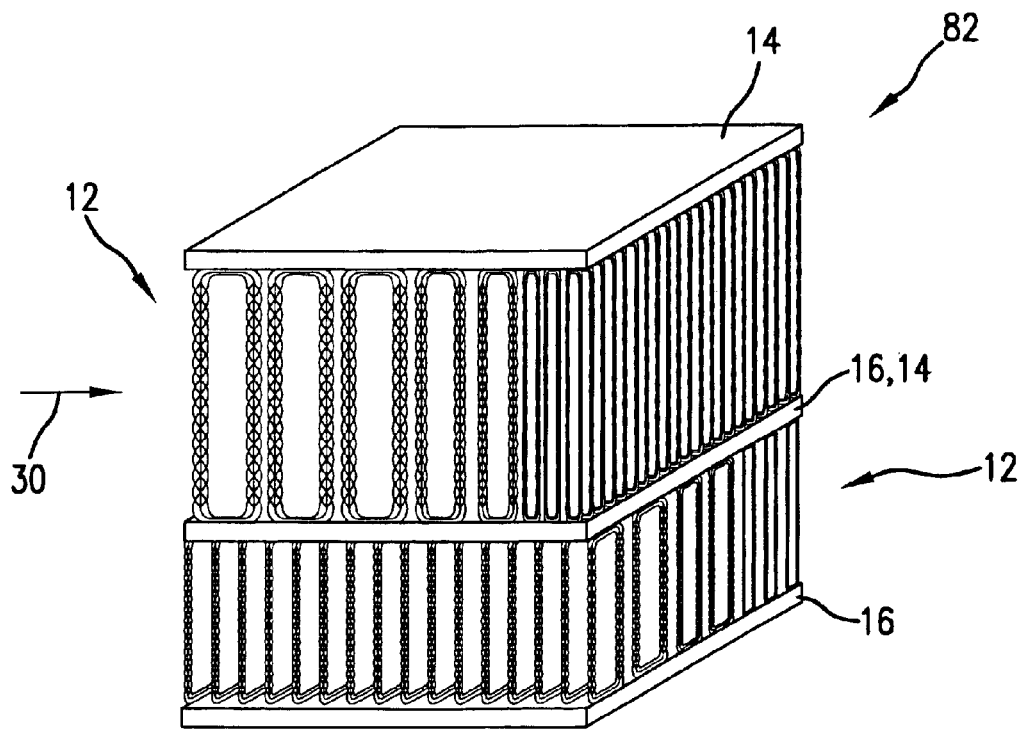
FIG. 12 is a heat exchange structure formed of heat transfer modules of the present invention.

The heat exchanger 82, shown in FIG. 12, includes two heat transfer modules 12 of the present invention attached each to the other by the respective module wall in a cross flow manner, however, the principles of the present invention may be applied to a wide variety of heat exchangers including counterflow heat exchangers.

The vast majority of electronics has been found to be susceptible to damage by thermal stress induced by a mismatch of the coefficients of thermal expansion (CTE) of the component. Therefore, the similarity of the CTE of the semiconductor (heat source) module walls 14 and 16, and insulator 84 is a desirable feature. In order to adjust the thermal expansion of the heat transfer structure, the module 12 may be fabricated from materials with a CTE similar to the CTE of the heat source material.

Figure 13:
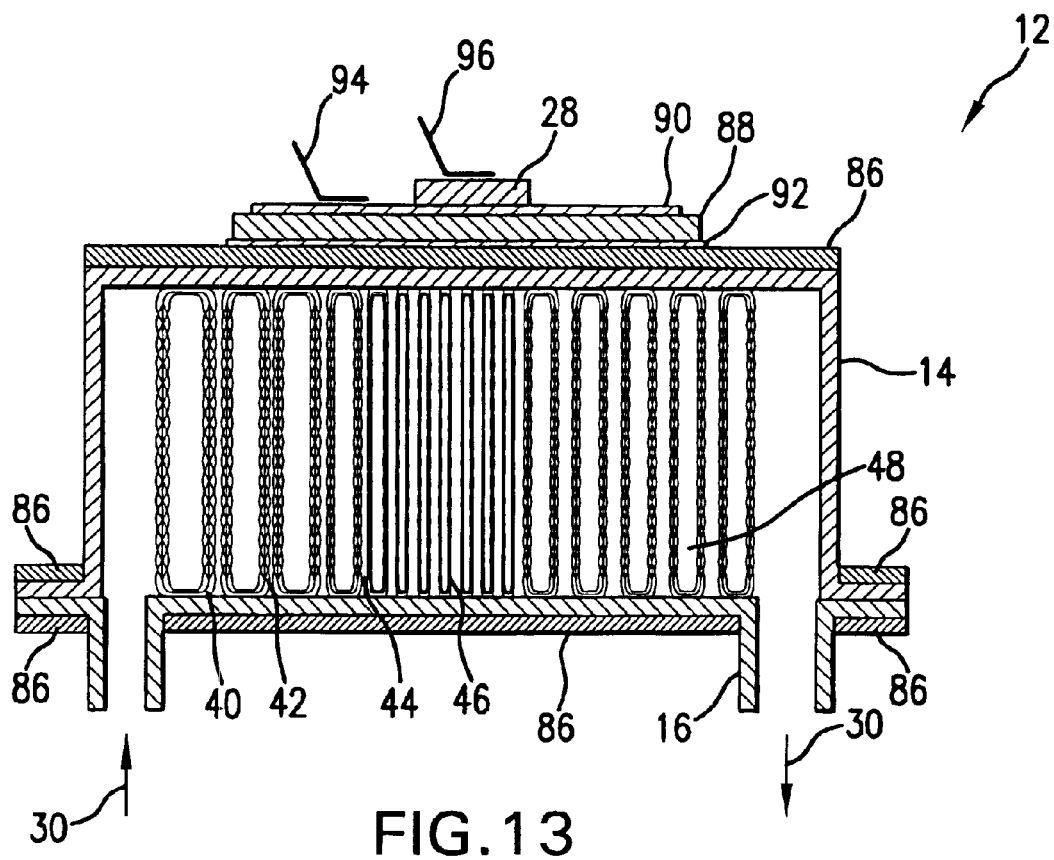
FIG. 13 is a cross-section of the heat transfer module of the present invention with a temperature expansion protective layer on the top and bottom of the heat transfer module.
Figure 14:
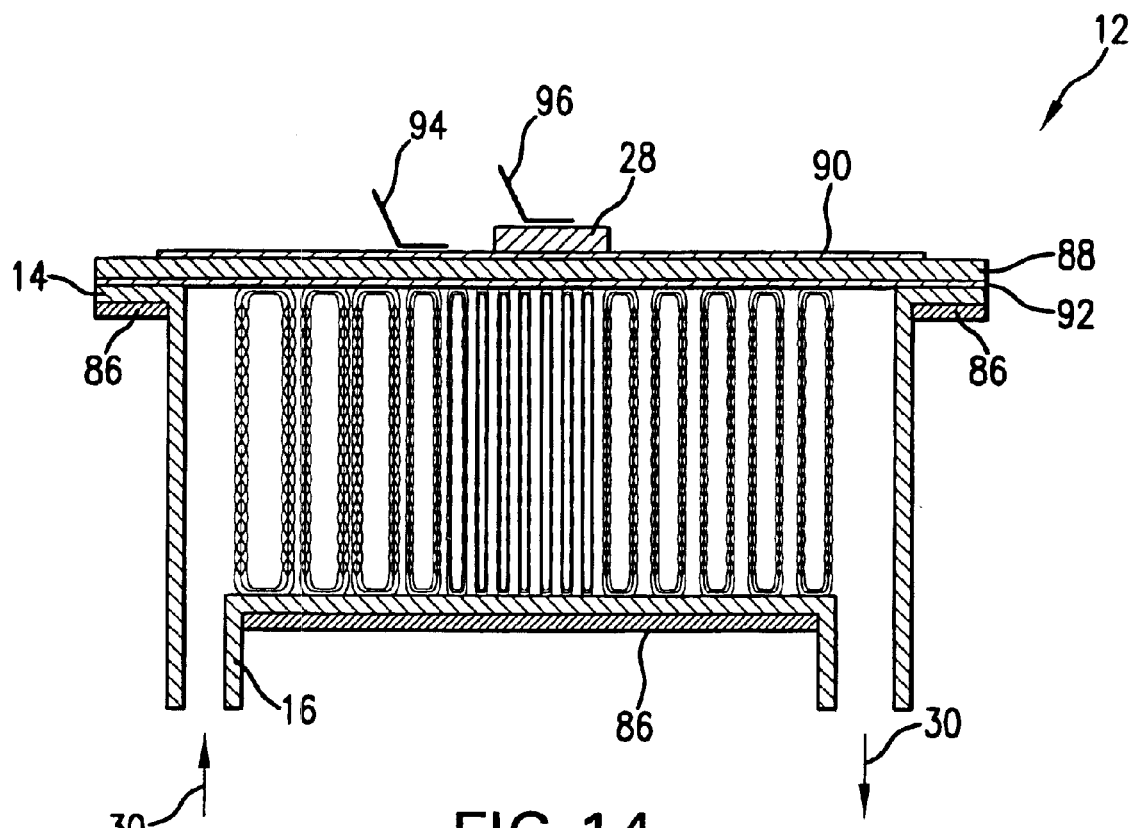
FIG. 14 is a cross-section of the heat transfer module of the present invention wherein a conductor-laminated ceramic insulator layer replaces one of the module walls.

Alternatively, a layer 86 of such material, as best shown in FIGS. 13 and 14, may be bonded or otherwise fixed to the module walls 14 and 16 of the heat transfer module 12. The layer 86 may be soldered, brazed, or diffusing bonded on the walls of the heat transfer module 12. The layer 86 may be formed from alloy, ceramic, or composite compositions. The layer 86 restricts thermal expansion of the relatively thin module walls of the heat transfer module. The CTE of the layer 86 and the heat transfer structures 40–48, may in this case be substantially different without creating significant thermal stress in the heat transfer assembly.

The heat transfer blocks 40–48 have low effective module resistance flow due to their porosity; and as a result, the high compliance of the heat transfer blocks accommodates thermal deformation without imposing significant stress on the heat transfer module 12.

The metal heat transfer module 12 (with the metal heat transfer blocks inside) are restricted from excessive thermal expansion by the layer 86 which also may be bonded to a ceramic insulator 88, laminated with the conductive layer 90 and 92 without imposing thermal stress on the insulator 88 and the heat source, as shown in FIG. 14. Alternatively, the layer 86 may be bonded directly to the pin fin heat transfer blocks. This type of integrated heat transfer module combines reliability with low thermal resistance and may be used typically in power electronics. Wiring 94 and 96 connected to the metal layer 90 and the heat source 26 or 28 also provide resistive heat input which has to be accommodated by the heat transfer module 12.

Further reduction of the thermal resistance between the semiconductor heat source and the cooling media may be obtained if the heat transfer blocks 40–48 are bonded directly to the conductor layer 92 on the insulator 88 as shown in FIG. 14. The semiconductor heat source 26 or 28 and the wiring 94 are bonded to the second conductor layer 90 on the insulator 88 thus providing heat input to the heat transfer structure. The conductor laminated insulator 88 may include a whole wall 14 of the heat transfer module 12 or a portion of the wall 14. The conductor laminated insulator can also include both walls 14 and 16 of the heat transfer module 12.

In a case where the conductor laminated insulator 88 is deposited on the wall 14 or part of the wall 14 of the heat transfer module 12 having a different CTE than the insulator 88, the thermal expansion of the opposite wall 16 introduces thermal stress on the insulator 88 and the semiconductor heat source 28. This stress can be minimized by readjusting the thermal expansion of the wall 16 by attaching a layer 86 to the wall 16 having a CTE similar to the CTE of the insulator 88. The layer 86 may be attached to the heat transfer module 12 in the areas of bonding the conductor laminated insulator 88 to the heat transfer module 12. The conductor laminated insulator 88 may also be connected to the rest of the heat transfer module 12 through a flexible connection allowing displacement.

The remainder of the heat transfer module 12 may be formed from material with a CTE similar to the CTE of the insulator 88 and the semiconductor heat source 28. In this case, the remainder of the heat transfer module 12 may be directly bonded to the conductor layer 92. In alternative embodiments, the structure shown in FIG. 14 may be used without the layer 86. In this type of structure, the entire heat transfer module 12 may be fabricated from material with a CTE similar to the CTE of the material of insulator 88. This material composition may include an alloy, ceramic, or composite composition. The preferable matrix for a composite composition would be metal or ceramic. If an electrical contact for the heat source 26 or 28 is required and the material used for the heat transfer module 12 is electrically non-conductive, the conductor layer 90 may be deposited or bonded on the heat transfer module 12 and connected to the heat source.

The entire composite heat transfer module 12 and heat transfer blocks 40–48 present the most beneficial embodiment for an integrated heat transfer structure 10 of the present invention. Carbon based composite materials currently have the highest thermal and mechanical properties. The CTE of composites may be varied and adjusted to provide maximum reliability of the integrated heat transfer structure.

Fibers provide high heat transfer area of heat transfer blocks combined with high heat transfer effectiveness of the structure and high heat transfer coefficients. A high efficiency heat transfer assembly of the present invention minimizes the effectiveness of spreading heat by intermediate layers between heat source 28 and heat transfer block 46. These layers create an additional conduction and thermal contact resistance which may be disadvantageous.

Figure 15:
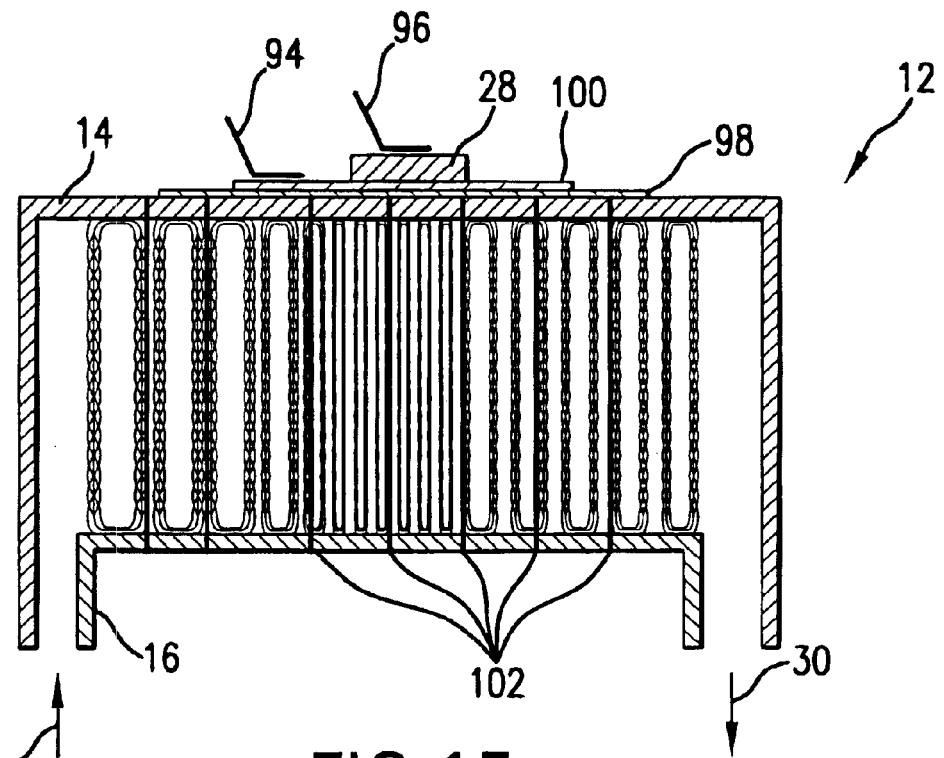
FIG. 15 is another embodiment of the fiber-reinforced heat transfer module of the present invention with the insulating layer formed directly on the module wall for reducing the thermal resistance of the heat sink of the present invention and with the reinforcing members.

The application of film insulator 98 and film conductor 100 shown in FIG. 15, minimizes the thickness of the layers and provides bonding of the layers with minimum contact resistance, thus further reducing thermal resistance of the heat sink. The heat transfer structure 10 with film insulator and film conductor 98 and 100 use the heat transfer module 12 formed of ceramic or metal mixtures. Currently this type of material composition provides maximum thermal conductivity. Ceramic heat transfer module 12 or a ceramic matrix in a composite heat transfer module performs insulating functions which may eliminate the need for an insulating layer 98. A very thin and effective insulating layer 98 can be deposited or created on a ceramic matrix material. For example, the inventors developed a substantially mono crystal layer of $SiO_2$ of 700 mm thickness on the surface of SiC which withstands 4 kV resulting in a minimization of thermal resistance.

Alternatively, the heat transfer module 12 and heat transfer blocks 40–48 can be fabricated from ceramic. It is preferable to use ceramics with high thermal conductivity such as AlN, BeO, SiC. The heat transfer module 12 and the heat transfer blocks 40–48 can be sintered from ceramic particles or fibers of different size. In a still further alternate fabrication, the assembly can be fabricated from a precursor and converted into a ceramic. For example, a SiC heat sink can be fabricated from a carbon rich precursor, integrated slurry of Si and SiC particles, and converted at high temperature to SiC. Or a carbon preform can be converted to SiC by infiltrating the preform with the Si containing gas or Si vapor at a temperature higher than 1450° C. Similar processes can be used for forming a SiC matrix in a C/SiC composite. In this composite, the carbon fiber has to be protected with an interface which withstands C/Si reaction.

Other material applicable for the heat transfer module of the present invention can include carbon/carbon composite or carbon/carbon composite partially converted to SiC. Additionally, the SiC matrix may be deposited using a standard CVI process, polymer precursor, or other known techniques.

The composite heat transfer module can be reinforced with the reinforcing members 102, shown in FIG. 15, extending between and penetrating the module walls 14 and 16 and the heat transfer blocks 40–48. The reinforcing members 102, penetrating both module walls 14 and 16, form the heat transfer structures of different density. The preform may be fabricated from carbon or carbon rich fibrous material and then converted to a composite or ceramic. The entire heat transfer structure can be fabricated by sewing, weaving, or stitching.

Figure 16:
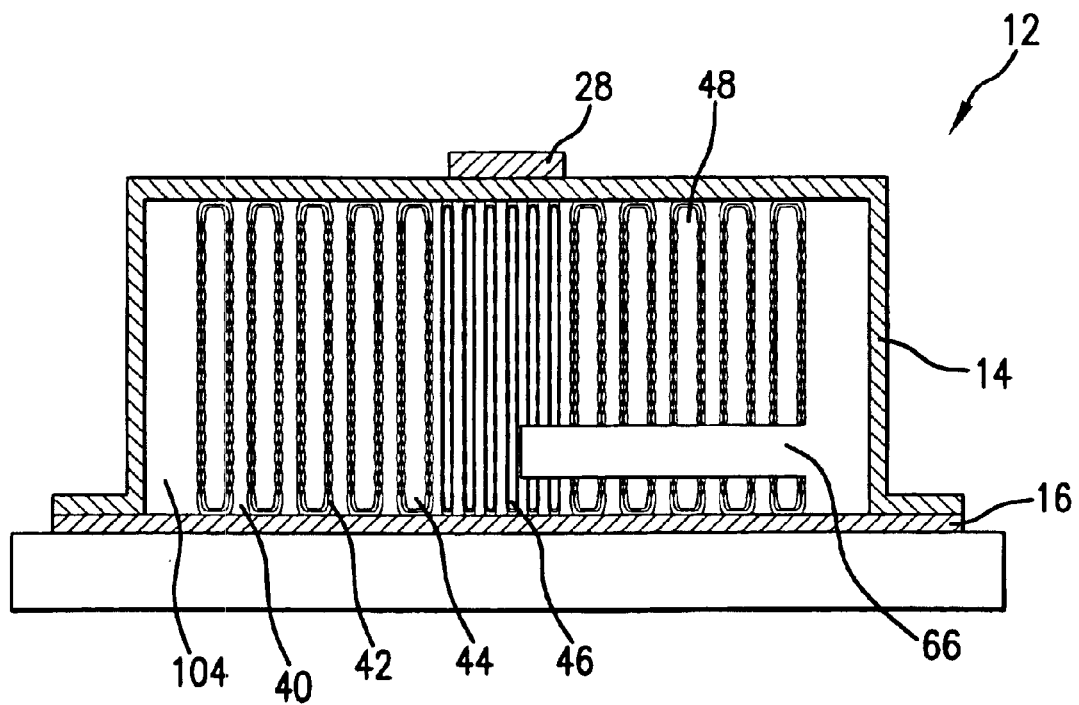
FIGS. 16 and 17 are cross-section and top views, respectively, of the heat transfer structure of the present invention used as a heat spreader.
Figure 17:
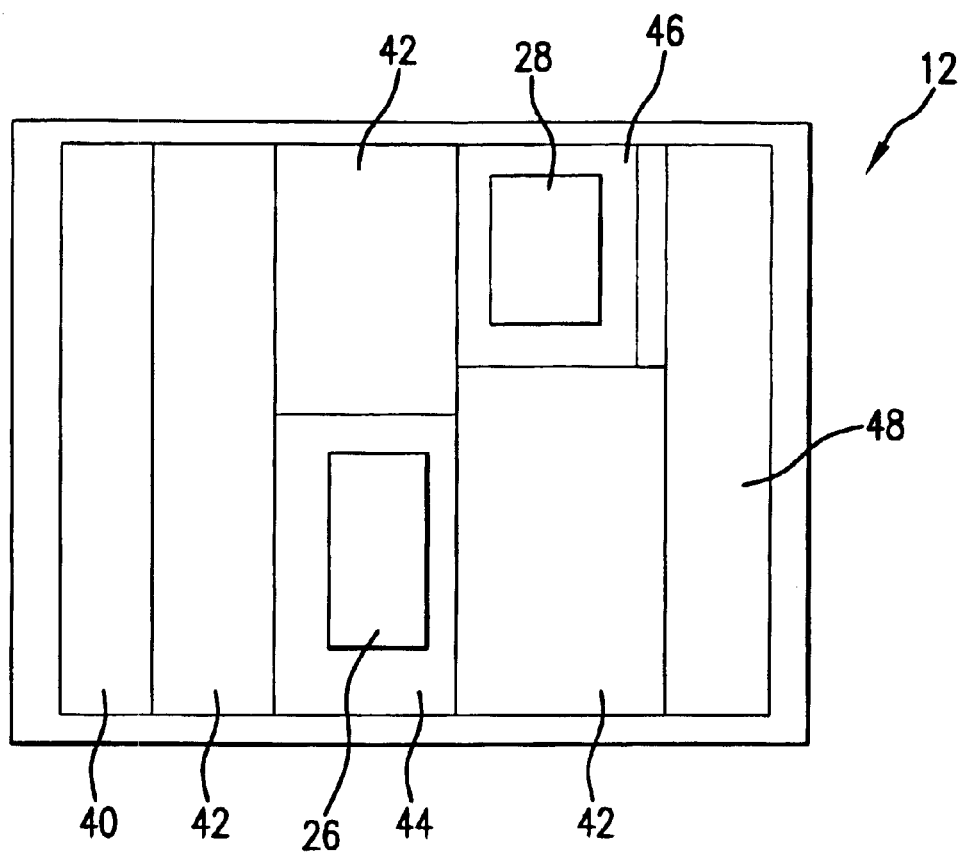
Figure 18:
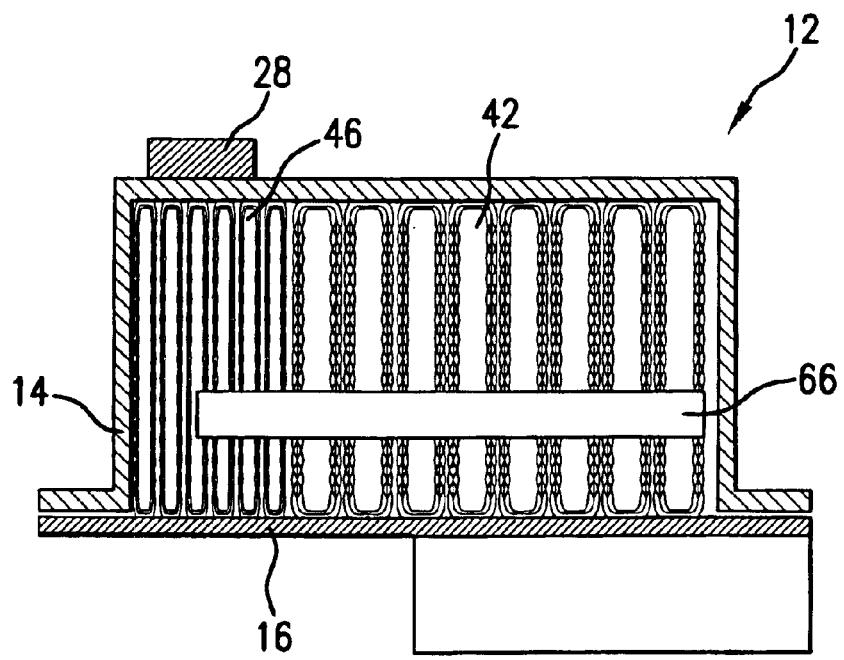
FIG. 18 is a schematic representation showing the implementation of the heat transfer structure of the present invention as a heat pipe.

The heat transfer module 12 of the present invention, in addition to operating as a heat sink, can operate as a heat spreader as shown in FIGS. 16 and 17, and/or as a heat pipe shown in FIG. 18. In this application, the heat transfer module 12 does not necessitate coolant inlet and outlet. The module 12 in this case will be partially charged with volatile fluid and sealed. Similar to the heat sink application, the variable density heat transfer blocks provide significant benefits to the performances of the heat spreader as well as the heat pipe. Highest density heat transfer block 46 is attached to the hottest heat source 26 or 28 on the heat spreader or heat pipe. The density of heat transfer blocks is gradually or periodically decreased as the distance from the heat source increases.

In this manner, the highest capillary action is provided under the heat source 26 and 28. Additional internal channels 66 can be added and connected to the external channel 104 in the heat spreader and heat pipe, depending on the operational pressure and vapor density. Alternatively, internal channels 64, which are formed during compression of the wire spirals, can provide sufficient vapor flow in these structures. The heat spreader and heat pipe can include all embodiments described in previous paragraphs with regard to the heat sink. They also can be reinforced by the reinforcing members 102. The embodiment of the heat sink shown in FIGS. 2 and 11, with the external means of the coolant circulation can be converted into the heat pipe or heat spreader by switching off the external means for coolant circulation 38.

Although the invention has been described herein in conjunction with specific embodiments thereof, many alternatives, modifications, and variations will be apparent to those skilled in the art. The present invention is intended to embrace all such alternatives, modifications, and variations that fall within the spirit and broad scope of the appended claims.

What is claimed is:

1. A heat transfer structure, comprising:
   at least one heat transfer module, said module including:
   first and a second module walls attached each to the other and forming a duct chamber therebetween;
   a coolant media in said duct chamber; and
   at least one localized heat source positioned at a predetermined location of at least one of said first and second module walls in thermal communication therewith;
   a plurality of heat transfer members located in said duct chamber extending between said first and second module walls in contiguous contact therewith, said heat transfer members having an increasing density concentration in the direction of flow of said coolant media and having a greatest density adjacent said at least one localized heat source;
   said density of the heat transfer members being selectively adjusted to said predetermined location of said at least one localized heat source.

2. The heat structure as recited in claim 1, where said heat transfer members are pin fin members.

3. The heat transfer structure as recited in claim 2, where said pin fin members are formed in a spring contour and compressed to a predetermined density in a direction substantially parallel to a longitudinal axis of the said heat transfer module.

4. The heat transfer structure of claim 3, wherein said springs include multi-strings wire.

5. The heat transfer structure of claim 2, wherein said pin fin members have maximum density at said predetermined location of said at least one localized heat source.

6. The heat transfer structure of claim 1, wherein said duct chamber is profiled in accordance with said predetermined location of said at least one localized heat source.

7. The heat transfer structure of claim 2, further comprising a plurality of heat transfer blocks, each of said heat transfer blocks including a respective portion of said pin fin members of a respective predetermined density thereof, a respective one of said heat transfer blocks with the highest density of said pin fin members therein being aligned with said predetermined location of said at least one localized heat source.

8. The heat transfer structure of claim 7, wherein the density of said pin fin members in each of said heat transfer blocks increases in the direction of said coolant media flow.

9. The heat transfer structure of claim 2, wherein the density of said pin fin members increases in a predetermined manner.

10. The heat transfer structure of claim 2, wherein the density of said pin fin members increases in predetermined increments.

11. The heat transfer structure of claim 1, further comprising an inlet port and an outlet port formed in said heat transfer module for said coolant media, external means coupled to said inlet port for circulating said coolant media through said heat transfer module, and external means coupled to said outlet port for cooling said coolant media.

12. The heat transfer structure of claim 6, further comprising flow restriction members mounted in said duct chamber.

13. The heat transfer structure of claim 12, wherein said flow restriction members are positioned in said duct chamber in predetermined areas to provide the flow of increased velocity of said coolant media at said predetermined location of said at least one localized heat source.

14. The heat transfer structure of claim 12, wherein said flow restriction members are positioned in said duct chamber to redistribute the flow of said coolant media to at least partially block the flow of said coolant media at the locations different than said predetermined location of said at least one localized heat source.

15. The heat transfer structure of claim 1, performing as a heat exchanger, further comprising a pair of said heat transfer modules attached each to the other by their respective module walls.

16. The heat transfer structure of claim 1, wherein said heat transfer structure is a heat pipe.

17. The heat transfer structure of claim 1, wherein said module walls are made of a material having the coefficient of thermal expansion matched to the coefficient of thermal expansion of a material of said at least one localized heat source.

18. The heat transfer structure of claim 1, further comprising a layer of a material having the coefficient of thermal expansion matched to the coefficient of thermal expansion of a material of said at least one localized heat source, said layer being secured to at least one of said first and second module walls to restrict thermal expansion thereof.

19. The heat transfer structure of claim 1, further comprising a ceramic insulator layer laminated on both sides thereof with conductor layers bonded to said heat transfer members in direct thermal contact therewith.

20. The heat transfer structure of claim 19, wherein the coefficient of thermal expansion of said ceramic insulator layer is matched to the coefficient of thermal expansion of a material of said at least one localized heat source.

21. The heat transfer structure of claim 1, wherein said module walls are formed from a material of the group of materials consisting of composites, ceramics, and metal alloys.

22. The heat transfer structure of claim 1, wherein said heat transfer members are formed from a material of the group of materials consisting of: metal wire, twisted wire, cabled wire, sintered particles, elongated variable size particles and fibers, carbon-rich particles and fibers, carbon, carbon-rich fibers, and carbon-rich fiber thread transferred into SiC or composite.

23. A method for transferring heat from a localized heat source, comprising the steps of:

attaching at least one localized heat source at a predetermined location on a first wall of a heat transfer module, said heat transfer module further having a second wall thereof secured to said first wall and forming a duct chamber therebetween;

installing a plurality of heat transfer members in said duct chamber having a variable density concentration, positioning said heat transfer members with the density concentration thereof increased in the direction of a flow of a coolant media in said duct chamber, and aligning one of said heat transfer members with greatest density concentration with said predetermined location of said at least one localized heat source;

installing flow restriction members in said duct chamber to increase velocity of a coolant media flow adjacent said predetermined location and to at least partially block said coolant media flow around said at least one localized heat source; and supplying the coolant media into said heat transfer module.

24. The method of claim 23, further comprising the step of:

forming said heat transfer members as pin fin members.

25. The method of claim 24, further comprising the step of:

forming said pin fin members as spring contours compressed to a predetermined density in a direction substantially parallel to a longitudinal axis of said heat transfer module.

* * * * *